United States Patent [19]
Hobrock

[11] Patent Number: 5,444,577
[45] Date of Patent: Aug. 22, 1995

[54] IMPURITY BAND OPTICAL FILTER

[75] Inventor: Lowell M. Hobrock, Los Angeles, Calif.

[73] Assignee: Hughes Aircraft Company, Los Angeles, Calif.

[21] Appl. No.: 821,320

[22] Filed: Jan. 13, 1992

Related U.S. Application Data

[63] Continuation of Ser. No. 529,414, May 29, 1990, abandoned.

[51] Int. Cl.$^6$ ............... G02B 5/22; H01L 31/00
[52] U.S. Cl. ................... 359/885; 359/359; 257/468
[58] Field of Search ......... 359/350, 359, 885; 250/338.4; 357/30 F; 257/468, 436

[56] References Cited

U.S. PATENT DOCUMENTS

| | | | |
|---|---|---|---|
| 3,020,406 | 2/1962 | Whitney | 350/1.1 |
| 4,004,148 | 1/1977 | Howard et al. | 250/338.4 |
| 4,142,198 | 2/1979 | Finnila et al. | 307/311 |
| 4,190,851 | 2/1980 | Finnila et al. | 357/30 |
| 4,246,590 | 1/1981 | Thomas et al. | 357/30 |
| 4,300,811 | 11/1981 | Ettenberg et al. | 350/1.1 |
| 4,568,960 | 2/1986 | Petroff et al. | 357/30 F |
| 4,871,220 | 10/1989 | Kolin | 350/311 |

OTHER PUBLICATIONS

Krabach et al, "Extrinsic Germanium Blocked Impurity Band Detector," Proceedings of the Third Infrared Detector Technolgy Workshop, pp. 117–123, Oct. 1989.

Primary Examiner—Ian J. Lobo
Attorney, Agent, or Firm—Hugh P. Gortler; Michael W. Sales; Wanda K. Denson-Low

[57] ABSTRACT

An optical filter for an infrared detector is provided by creating an impurity band in a semiconductor substrate onto which the infrared detector is epitaxially grown. The impurity band provides a range of absorption and a long wavelength pass band characteristic. The range of absorption is broadened by doping the substrate with a dopant of different photoelectric threshold from the dopant used to create the impurity band.

5 Claims, 1 Drawing Sheet

IMPURITY BAND OPTICAL FILTER

This is a continuation of application Ser. No. 529,414, filed May 29, 1990 now abandoned.

BACKGROUND OF THE INVENTION

1. Field of the Invention

The subject invention relates to optical systems and, more particularly, to an improved infrared semiconductor optical filter epitaxially joinable with an infrared detector.

2. Description of Related Art

State-of-the-art long wavelength infrared (LWIR) optical filters use multilayer dielectric (MLD) interference to transmit the pass band and reflect the out-of-band energy. To achieve high out-of-band rejection (low transmission $T \leq 10^{-4}$) over broad wavelength regions, state-of-the-art MLD interference filters employ many layers, for example, up to 300. These layers are deposited at high temperatures, resulting in a very thick, highly stressed coating. Since the coating has such high stress, it must be deposited on two or more substrates, or the layers will not adhere.

Such filters are thus relatively complex. They are also very expensive. A filter one inch in diameter with high out-of-band rejection presently costs about $100,000.00. Accordingly, it has appeared desirable to the inventor to develop an alternate approach to achieving optical band-pass filtering, which is more economical, less complex, and not subject to the stress problems of the prior art.

SUMMARY OF THE INVENTION

It is therefore an object of the invention to improve optical filters;

It is another object of the invention to greatly reduce the number of dielectric layers required in an optical filter;

It is another object of the invention to reduce the cost and complexity of optical filters employed in long wavelength infrared optical filters; and It is another object of the invention to eliminate stress problems attendant to prior art LWIP optical filter designs.

According to the invention, a semiconductor exhibiting low lattice absorption is heavily doped ($n \sim 5 \times 10^{17}$ $cm^{-3}$) with a first impurity ion, thereby forming an impurity band in the semiconductor. When cooled to the appropriate cryogenic temperature, e.g. 15 degrees Kelvin, the impurity band has very high optical absorption at wavelengths below the photoelectric threshold ($\lambda_{th}$), which provides the high out-of-band rejection desired in LWIR optical filters. The semiconductor transmits at wavelengths greater than the photoelectric threshold, thereby creating a long wavelength pass band semiconductor optical filter.

Further according to the invention, an infrared detector may be integrally formed with the semiconductor filter, for example, in an epitaxial structure. The infrared detector receives light filtered by the LWIR semiconductor optical filter and adds a cutoff to the transmittance characteristic, to form an overall pass band. According to another feature of the invention, a second impurity band generated by a second impurity ion may also be added to increase the wavelength region over which the filter will have high out-of-band rejection.

BRIEF DESCRIPTION OF THE DRAWINGS

The just-summarized invention will now be described in detail in conjunction with the drawings, of which.

DESCRIPTION OF THE PREFERRED EMBODIMENTS

Figure 1:
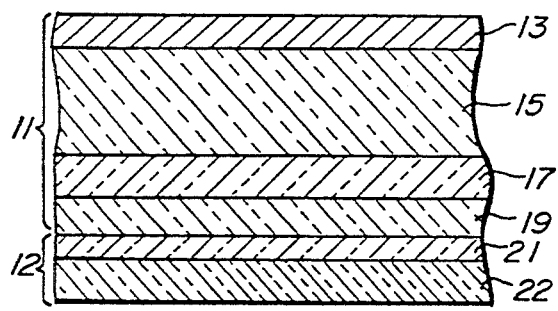
FIG. 1 is a cross-sectional schematic diagram illustrating a long wavelength pass (LWP) filter integrally formed with an infrared detector according to the preferred embodiment.

FIG. 1 illustrates a long wavelength pass (LWP) filter 11 according to the preferred embodiment. The filter 11 includes an antireflective coating layer 13, a silicon semiconductor substrate layer 15, a filter layer 17 comprising semiconductor silicon doped with, gallium (Si:Ga), and a semiconductor silicon blocking layer 19. The structure of FIG. 1 further includes an infrared detector structure 12 including an implanted contact 21 of semiconductor silicon doped with antimony (Si:Sb), and a detector layer 22 formed of semiconductor silicon doped with arsenic (Si:As). The implanted contact 21 forms the bias electrode for the detector layer 22. The use of an Si:As detector layer per se is known in the art.

The Si:Ga filter layer 17 is doped at $n \sim 5 \times 10^{17}$ $cm^{-3}$, the silicon layer 15 at $n \sim 10^{12}$ $cm^{-3}$ the Si:Sb contact 21 at $n \sim 10^{19}$ $cm^{-3}$, and the Si:As detector layer 22 at $n \sim 5 \times 10^{17}$ $cm^{-3}$. The thicknesses and doping of the respective layers 13, 15, 17, 19, 21, 22 are summarized in the following table:

| Material | Thickness ($\mu m$) | Doping (atoms/$cm^3$) |
|---|---|---|
| AR (13) | 20 to 28 | — |
| Si (15) | ~500 | $10^{12}$ |
| Si:Ga (17) | 100 | $5 \times 10^{17}$ |
| Si (19) | 20 | — |
| Si:Sb (21) | 2 | $10^{19}$ |
| Si:As (22) | 40 | $5 \times 10^{17}$ |

The filter layer 17 is doped to provide high absorption over a relatively broad band. Doping the silicon layer lightly at $10^{16}$ atoms per cubic centimeter (atoms/$cm^3$) results in creating an absorption level and relatively narrow absorption. By doping the silicon layer more strongly at $10^{17}$ to $10^{18}$ atoms/$cm^3$, a spreading of states occurs, which results in creation of an impurity band. The impurity band generates a commensurate band of absorption, which permits creation of an LWP filter.

The silicon blocking layer 19 functions to isolate free carriers, which might interfere with the detector 12. Such electrons are generated when light is absorbed through operation of the impurity band of filter layer 17. If desired, an ion implanted grid might also be used to collect or assist in collection of such free electrons.

The silicon semiconductor substrate 15 forms the foundation of the structure. Silicon is particularly convenient since it is effectively transparent to the wavelengths of interest, i.e., it exhibits low lattice absorption in the spectrum of interest. Other semiconductor materials, such as germanium, may prove useful in some applications.

The gallium doped silicon layer 17 is formed preferably as an epitaxial layer on the substrate 15 and 10 may be formed by conventional procedures such as chemical vapor deposition (CVD) or molecular beam epitaxy (MBE). The additional silicon layers 19, 21, 22 may also be epitaxially grown. The antireflective coating 13 may be selected from conventional materials such as cadmium telluride (CdTe) and thorium fluoride (TF$_3$), and conventionally applied.

The embodiment of FIG. 1 thus employs an impurity band layer 17 to make an LWP filter. The out-of-band (undesired) energy is absorbed by the impurity band layer 17 and the cutoff wavelength is determined by the photoelectric threshold wavelength for that particular impurity. Significantly, the embodiment of FIG. 1 provides an LWP filter 11 grown on the same substrate as the Si:As detector layer 22.

Figure 2:
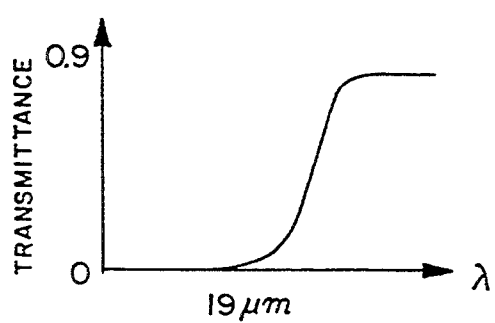
FIG. 2 is a graph illustrative of transmittance versus wavelength in the embodiment of FIG. 1.

The transmission through the substrate, Si:Ga layer 17, Si blocking layer 15, and Si:Sb layer 21 to the detector layer 22 looks approximately like that shown in FIG. 2. Energy below approximately 19 micrometers $\mu$m) is absorbed, while that above is transmitted.

Figure 3:
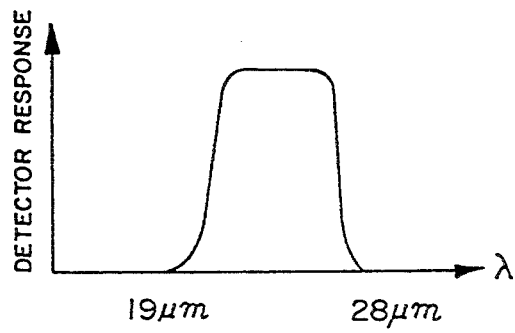
FIG. 3 is a graph of transmittance versus wavelength illustrative of the approximate spectral response of the embodiment of FIG. 1.

The spectral response of the output of the detector 12 for the embodiment of FIG. 1 looks approximately as shown in FIG. 3. The detector 12 thus applies a high frequency cutoff at 28 $\mu$m to the transmittance characteristic, resulting in an overall band pass effect.

To increase or spectrally broaden the absorption, one can use a substrate 15 that has been doped with an impurity ion different from the impurity ion in filter layer 17. The selection of this impurity ion is determined by the function (i.e., increased absorption or a broader spectral absorption region) desired.

Figure 4:
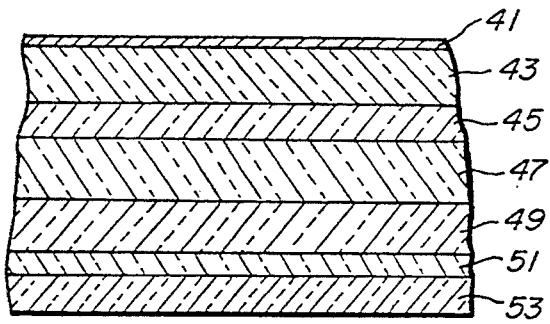
FIG. 4 is a schematic cross-sectional diagram of an alternate embodiment.

FIG. 4 represents such an approach wherein the substrate 43 is doped with a different impurity, in this case magnesium (Mg), having a lower cutoff than the gallium dopant of the filter layer numbered 47 in FIG. 4. The structure of FIG. 4 is summarized in the following table:

| Layer No. | Type | Doping Concentration (cm$^{-3}$) | Thickness ($\mu$m) |
|---|---|---|---|
| 41 | AR | — | 20–28 |
| 43 | Si:Mg | n ~ 5 × 10$^{16}$ | 500 |
| 45 | Si | n ~ 10$^{12}$ | 20 |
| 47 | Si:Ga | n ~ 5 × 10$^{17}$ | 100 |
| 49 | Si | n ~ 10$^{12}$ | 20 |
| 51 | Si:Sb | n ~ 10$^{19}$ | 2 |
| 53 | Si:As | n ~ 5 × 10$^{17}$ | 40 |

As will be appreciated, the difference between FIGS. 1 and 4 lies in layers 43 and 45. As mentioned above, the substrate 43 is doped with a different impurity ion (Mg in the example) to 5×10$^{16}$ or 10$^{17}$ cm$^{-3}$ to create a second impurity band. An additional blocking layer 45 is provided, for example, as an epitaxially grown layer, to prevent carriers generated in the substrate 43 and/or the filter impurity band layer 47 from being collected by the detector layer 53. Other approaches to collect such carriers include a bias or other electrostatic shielding method to eliminate carriers from the substrate 43 and/or the Si:Mg impurity band layer 47. The remaining silicon-based layers 47, 49, 51, 53 again may be epitaxially grown according to known procedures.

Figure 5:
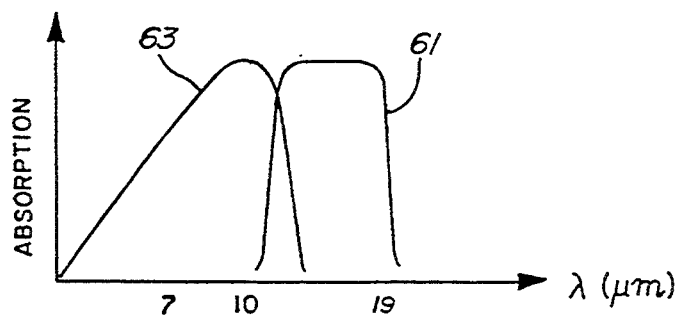
FIG. 5 is a graph of absorption versus wavelength illustrative of operation of an embodiment according to FIG. 4.

The approximate effect of addition of a second impurity layer 43 is shown in FIG. 5. FIG. 5 shows a broad band absorption characteristic 61 resulting from the gallium dopant in filter layer 47 on which is superimposed the additional absorption characteristic 63 resulting from the second impurity band layer 43.

Various absorption characteristics can be created using various impurities, as may be appreciated from the following table for Si:Y where Y is the impurity type used to create the optical filter impurity band.

| Substrate | Y | $\lambda$c ($\mu$m) |
|---|---|---|
| Si | As | 28 |
| Si | Ga | 19.07 |
| Si | Bi | 17.97 |
| Si | Mg | 11.3 |
| Si | S | 11.3 |
| Si | Te | 8.8 |
| Si | In | 7.75 |

Those skilled in the art will appreciate the various combinations and characteristics of filters which may be constructed from such impurities according to the teachings herein.

As disclosed above, with an impurity band absorbing layer as described in FIGS. 1 and 4, an optical filter can be grown directly onto a substrate carrying an infrared detector. Such a unitary structure is low in cost and compact in size, which results in no vignetting of wavelength bands. The reduced coating complexity lowers cost to a figure on the order of $10,000.00 per color versus $100,000.00 to $200,000.00 per color with conventional approaches. The extrinsic/semiconductor structure absorbs out-of-band and has a high laser damage threshold and insensitivity to coating pinholes. Finally, the fact that there is no change in refractive index from Si:Y to Si, means that there are no unwanted reflections between filter and detector.

Those skilled in the art will appreciate from the foregoing discussion that the just-disclosed embodiments are subject to numerous adaptations and modifications without departing from the scope and spirit of the invention. Therefore, it is to be understood that, within the scope of the appended claims, the invention may be practiced other than as specifically described herein.

What is claimed is:

1. An LWIR optical filter detector device, comprising:

a semiconductor substrate material;

a first impurity layer created in the substrate for absorbing out of band energy and transmitting LWIR energy above a minimum transmittance level within a passband, the impurity layer being doped with an impurity to a concentration of 10$^{17}$–10$^{18}$ such that the impurity layer has a separation of states at cryogenic temperatures for transforming the absorbed out of band energy into free carriers;

a second impurity layer created in the substrate;

means for cooling the first and second impurity layers within the substrate to cryogenic temperatures of approximately 15 degrees Kelvin;

a blocking layer within the substrate for isolating free carriers created from the absorbed out of band energy; and an infrared detector within the substrate, such that the detector senses the transmitted energy, the detector adding a cutoff at a maximum transmittance level of the passband such that a combination of the minimum transmittance level of created by the impurity layer and the maximum transmittance level created by the detector provides a passband filter.

2. The optical filter of claim 1 wherein said substrate comprises semiconductor silicon.

3. The optical filter of claim 2 wherein said substrate comprises semiconductor germanium.

4. The optical filter of claim 2 wherein said. impurity is gallium.

5. The infrared detector of claim 1 wherein the out of band energy includes light having wavelengths over a selected threshold wavelength, and the passband energy includes light having wavelengths below said threshold wavelength.

* * * * *